(12) United States Patent
Faure et al.

(10) Patent No.: US 11,899,061 B2
(45) Date of Patent: Feb. 13, 2024

(54) VOLTAGE MONITORING CIRCUIT FOR INTERFACE

(71) Applicant: Apple Inc., Cupertino, CA (US)

(72) Inventors: Fabien S. Faure, Santa Clara, CA (US); Si Chen, Fremont, CA (US); Mansour Keramat, Los Gatos, CA (US); Arnaud J. Forestier, San Diego, CA (US)

(73) Assignee: Apple Inc., Cupertino, CA (US)

( * ) Notice: Subject to any disclaimer, the term of this patent is extended or adjusted under 35 U.S.C. 154(b) by 299 days.

(21) Appl. No.: 17/347,284

(22) Filed: Jun. 14, 2021

(65) Prior Publication Data

US 2022/0397604 A1    Dec. 15, 2022

(51) Int. Cl.
| | | |
|---|---|---|
| G08B 21/00 | (2006.01) | |
| G01R 31/317 | (2006.01) | |
| H03M 1/12 | (2006.01) | |
| G01R 13/02 | (2006.01) | |
| G06F 11/10 | (2006.01) | |
| G01R 19/25 | (2006.01) | |

(52) U.S. Cl.
CPC ..... *G01R 31/31713* (2013.01); *G01R 13/029* (2013.01); *G01R 13/0272* (2013.01); *G01R 19/2503* (2013.01); *G01R 31/31705* (2013.01); *G06F 11/10* (2013.01); *H03M 1/12* (2013.01)

(58) Field of Classification Search
CPC .......... G01R 31/31713; G01R 13/0272; G01R 13/029; G01R 19/2503; G01R 31/31705; G01R 19/2509; G06F 11/10; H03M 1/12

USPC .......... 340/660, 657, 661, 662, 663
See application file for complete search history.

(56) References Cited

U.S. PATENT DOCUMENTS

| | | | |
|---|---|---|---|
| 7,023,946 B2 | 4/2006 | Sawada et al. | |
| 7,800,396 B2 | 9/2010 | Yamamoto et al. | |
| 8,908,671 B2 * | 12/2014 | Morita | H04B 1/40 370/503 |
| 9,853,553 B2 * | 12/2017 | Zhang | H02M 3/33523 |
| 10,554,039 B2 | 2/2020 | Asam | |
| 10,614,892 B1 * | 4/2020 | Hsiao | G11C 29/00 |
| 2006/0097753 A1 * | 5/2006 | Shibata | H04L 25/0282 326/83 |
| 2021/0174157 A1 * | 6/2021 | Wang | G06K 19/0707 |
| 2021/0312055 A1 * | 10/2021 | Kloth | G06F 9/4406 |

* cited by examiner

*Primary Examiner* — Anh V La
(74) *Attorney, Agent, or Firm* — Kowert, Hood, Munyon, Rankin & Goetzel, P.C.; Erik A. Heter; Dean M. Munyon (57) ABSTRACT

A voltage monitoring circuit is disclosed. An apparatus includes a first physical interface circuit and a real-time oscilloscope circuit configured to monitor a first voltage provided to the first physical interface circuit. The real-time oscilloscope is configured to receive an indication that an error was detected in data transmitted from the first physical interface to a second physical interface circuit. The real-time oscilloscope is further configured to provide for debug, to a host computer external to the first interface, information indicating a state of the first voltage at a time at which the error was detected.

20 Claims, 7 Drawing Sheets

VOLTAGE MONITORING CIRCUIT FOR INTERFACE

BACKGROUND

Technical Field

This disclosure is directed to integrated circuits, and more particularly, to the monitoring of voltages on an integrated circuit.

Description of the Related Art

High speed interfaces between integrated circuits, or between units on a single integrated circuit, are common in modern electronic systems. These interfaces allow rapid transmission of data between two different agents. High-speed interfaces include serial interfaces, as well as parallel interfaces in which a number of bits are transmitted across the interface in concurrently with one another. At times, the transmission of data over a high-speed interface may include a significant amount of simultaneous switching of circuits in the interface. A power supply that provides power to circuits in the interface may thus be tasked with maintaining a supply voltage within prescribed limits during such switching.

SUMMARY

A voltage monitoring circuit for an interface is disclosed. In one embodiment, an apparatus includes a first physical interface circuit and a real-time oscilloscope circuit configured to monitor a first voltage provided to the first physical interface circuit. The real-time oscilloscope is configured to receive an indication that an error was detected in data transmitted from the first physical interface circuit to a second physical interface circuit. The real-time oscilloscope is further configured to provide for debug, to a host computer external to the first interface, information indicating a state of the first voltage at a time at which the error was detected.

In one embodiment, the real-time oscilloscope (which may alternately be referred to as an event capture circuit) includes an analog-to-digital converter (ADC) and a memory. The ADC is configured to convert samples of the first voltage into digital values, which are then stored in the memory. In one embodiment, the memory is a first-in, first-out (FIFO) memory. In response to receiving the indication of an error from the second physical interface circuit, the ADC is configured to discontinue sampling the first voltage, and the digital values stored in the memory (and corresponding to recent samples) are provided to the host computer.

In one embodiment, the monitored voltage is a supply voltage provided to transmitter circuitry in the first physical interface circuit. The transmitter circuitry may be configured to transmit a plurality of bits in parallel to the second physical interface circuit. The event capture circuit may thus detect and capture drops in the supply voltage that may occur due to simultaneous switching events. It is noted however, that this is only one possible application, and the event capture circuit disclosed herein may be used to monitor voltages other than supply voltages.

BRIEF DESCRIPTION OF THE DRAWINGS

The following detailed description makes reference to the accompanying drawings, which are now briefly described.

DETAILED DESCRIPTION OF EMBODIMENTS

The present disclosure is directed to a circuit for monitoring voltages in systems, including (but not limited to) the monitoring of supply voltages associated with interfaces across which signals are transmitted. Transferring signals across an interface, whether a die-to-die interface (e.g., from one integrated circuit to another) or on a single integrated circuit, presents challenges to maintaining supply voltages to devices coupled to the interfaces. For example, transmitters coupled to receive a supply voltage and transmit signals in parallel may be subject to simultaneous switching events. In a simultaneous switching event, a large number of bits transmitted across a parallel interface may change states substantially simultaneously. This in turn can put strain on a power supply coupled to such a transmitter and thus cause a sudden, undesirable drop in the supply voltage (sometimes referred to as a droop).

In some cases, the monitoring of supply voltages on both sides of an interface is difficult. For example, in die-to-die interfaces, the different integrated circuits may be designed and manufactured by different entities. Accordingly, with different design and manufacturing goals, a full monitoring of the interface and voltages associated therewith may not be possible. The present disclosure makes use of the insight that if a single entity controls both sides of the interface (or, if there is cooperation between entities controlling the design of each side of the interface), it becomes possible to more fully monitor various signals associated with the same. Among other things, timely feedback loops that cross the interface may be implemented.

Accordingly, the present disclosure contemplates an event capture circuit, which may be also referred to herein as a real-time oscilloscope, or RTO for short. An RTO may be implemented on at least one side of the interface from which signals are transmitted to the other side. The RTO may monitor a first voltage, such as a supply voltage. Circuitry for detecting an error in transmitted data may be implemented on the other (receiving) side of the interface. When an error is detected in data on the receiving side of the interface, an indication of the same is transmitted to the RTO on the transmitting side. In response to receiving the indication, the RTO provides information indicating a state of the first voltage at the time the error was detected to a host computer external to the first interface.

In one embodiment, an RTO in a first interface includes an analog-to-digital converter (ADC) configured to convert samples of, e.g., a supply voltage into digital values. The digital values may be stored in a memory, such as first-in, first-out (FIFO) memory. The supply voltage may also be provided to transmitter circuitry in the first interface. A second interface includes receiver circuitry configured to receive data transmitted from the first interface. The second interface may also include error correction code (ECC) circuitry configured to detect errors in data received from the first interface. In response to detecting an error, the ECC circuit may generate an error indication that is transmitted to the RTO in the first interface.

In response to receiving the error indication, the ADC may discontinue converting samples of the supply voltage, while the digital values stored in the FIFO may be conveyed to a host computer external to the integrated circuit upon which the first interface is implemented. The digital samples may indicate a state of the supply voltage at the time at which the error was detected. This information may be used for debug purposes. For example, a supply voltage droop may have occurred concurrent with the transmission of the data from which an error was detected, with the RTO having captured this event. The digital samples indicative of a voltage droop may be correlated with the data transmitted from the first interface to the second interface to provide further insight as to the cause of the error.

The present disclosure will now discuss the RTO/event capture circuit in further detail, along with a system in which it may be implemented. The discussion begins with a basic embodiment of an RTO. Thereafter, the disclosure discusses various detailed embodiments, as well as placing them in context of a larger system. Discussion of operation of both general and detailed embodiments follows, with the disclosure concluding with an illustration of a system in which the apparatus of the present disclosure may be included.

Figure 1:
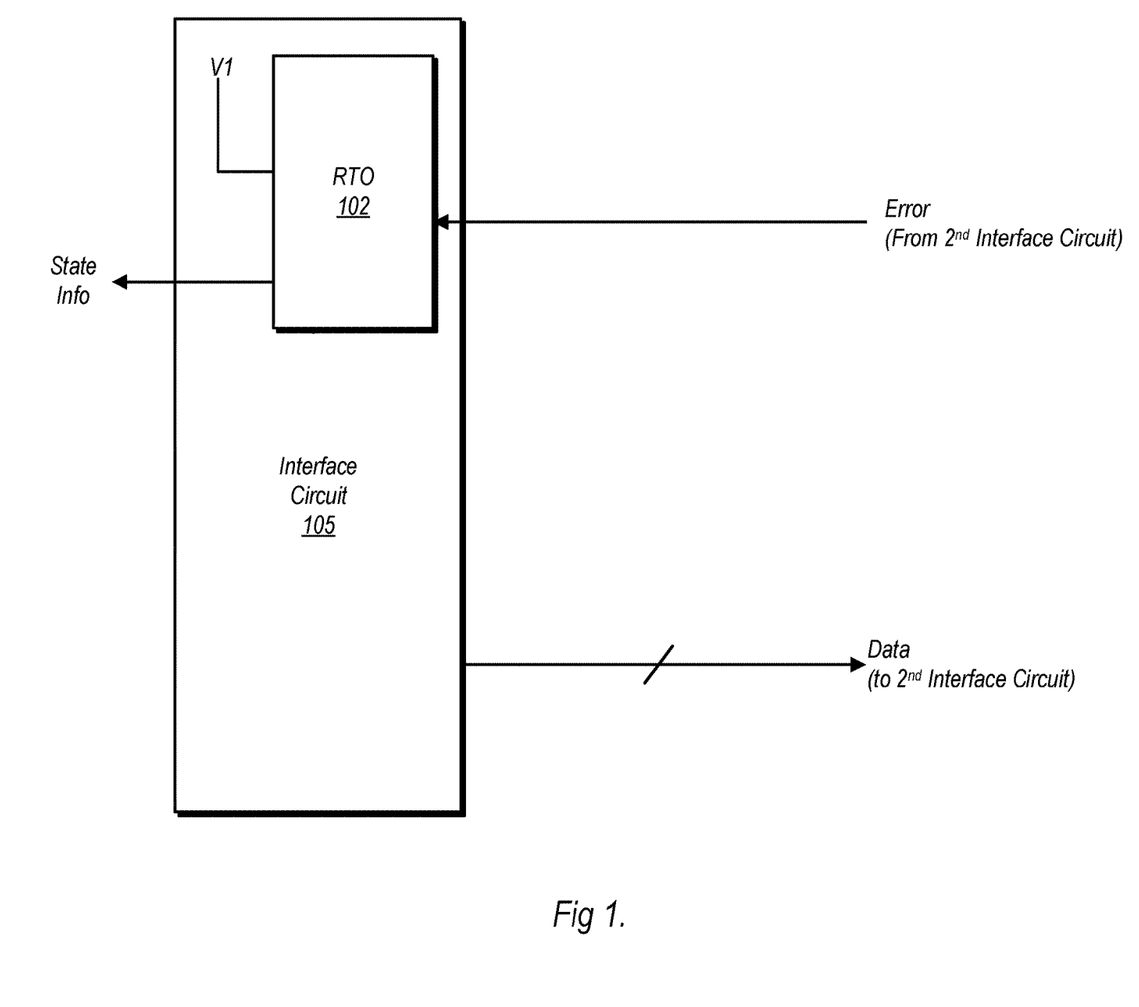
FIG. 1 is a block diagram of one embodiment of an interface circuit having a real time oscilloscope/event capture circuit.

RTO/Event Capture Circuit in an Interface:

FIG. 1 is a block diagram illustrating one embodiment of an RTO/event capture circuit. In the embodiment shown, RTO 102 is implemented in interface circuit 105. Interface circuit 105 may be implemented in an integrated circuit, and may be coupled to a corresponding interface circuit. The corresponding interface circuit may be in a different integrated circuit, although embodiments are possible and contemplated where it is implemented in the same integrated circuit as interface circuit 105 shown here.

RTO 102 in the embodiment shown is configured to monitor a voltage V1. This voltage may, in one embodiment, be a supply voltage that is provided to circuitry within interface circuit 105. Such circuitry may include transmitter circuitry configured to transmit data from interface circuit 105 to a correspondingly coupled interface circuit. However, the disclosure is not limited to using RTO 102 to monitor a supply voltage. Virtually any type of voltage from one of a number of different sources may be monitored by RTO 102. For example, RTO 102 could be used to monitor a bandgap voltage provided by a bandgap voltage generator, one of a number of different voltages in a voltage regulator (e.g., a feedback voltage), and so on.

Interface circuit 105 in the embodiment shown is configured to transmit data to a second interface circuit. The data may be transmitted in serial or parallel. In the second interface circuit, the data may be checked for errors. If circuitry within the second interface circuit detects an error, an indication may be generated and transmitted to RTO 102 in interface circuit 105. In response to receiving the indication, RTO 102 may provide the state information to, e.g., an external computer that is used for debugging purposes. The state information may include the state of the monitored voltage, V1, at the time at which the error was detected. The state information regarding voltage V1 may also be correlated with the data that was transmitted at the time of the event, as well as data transmitted prior thereto. Using one example, the event may be a voltage droop, and may be correlated with transmitted data that included a large simultaneous switching event (e.g., a large number of bits switched state from the most recent previous transmission). Thus, analysis of the correlated information may indicate that a simultaneous switching event was the cause of a voltage droop.

Figure 2:
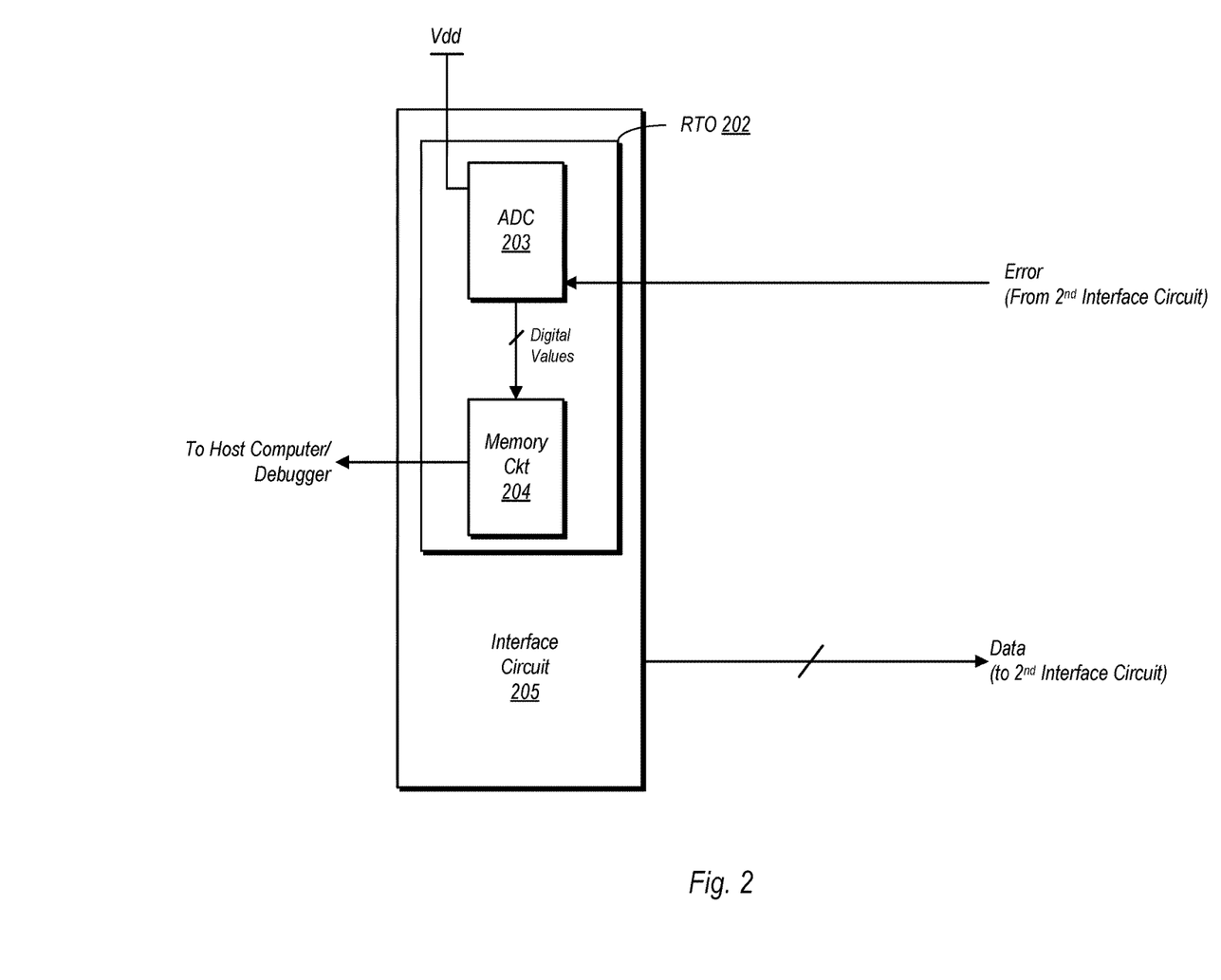
FIG. 2 is a block diagram illustrating further details of one embodiment of an interface circuit having a real time oscilloscope/event capture circuit.

Detailed Embodiments of an RTO and Corresponding Systems:

FIG. 2 is a block diagram illustrating another embodiment of an interface circuit having an event capture/RTO circuit. In the embodiment shown, RTO 202 includes an ADC 203 and a memory circuit 204. ADC 203 in the embodiment shown is coupled to receive a supply voltage Vdd. The supply voltage Vdd may be provided to a sampling input of ADC 203. Accordingly, the supply voltage Vdd may be sampled and converted into corresponding digital values. These digital values may then be stored in memory circuit 204, which can be implemented as any suitable type of memory. Digital values stored in memory circuit 204 may be provided to a host computer/debugger external to interface circuit 205 for further analysis of fluctuations in the supply voltage Vdd.

Although not explicitly shown in FIG. 2, interface circuit 204 may include transmitter circuitry that operates based on the supply voltage Vdd. The transmitter circuitry may transmit data to a second interface circuit. The second interface circuit may include circuitry to detect errors in the transmitted data (e.g., parity errors detected using ECC circuitry). In response to detection of an error, an error indication is generated within the second interface circuit. The error indication is conveyed to RTO 202, and more particularly, to ADC 203 in the embodiment shown. ADC 203 may respond to the error indication by discontinuing to take further samples of the supply voltage. Memory circuit 204 may also respond to the error indication, by conveying at least some of the stored digital samples of supply voltage Vdd to a host computer/debugger.

Since there is some propagation delay between the time the erroneous data is transmitted and the time sampling is stopped by ADC responsive to receiving the error indication, at least some of the digital values stored in memory circuit 204 may correspond to samples taken after the error initially occurred. Accordingly, the digital values provided by memory circuit 204 to a host computer/debugger may include those that correspond to samples taken both before and after the error occurred in addition to those taken at the time of the error. This may provide a fuller picture of any changes of supply voltage Vdd leading up to the error and for at least a small amount of time thereafter.

Figure 3:
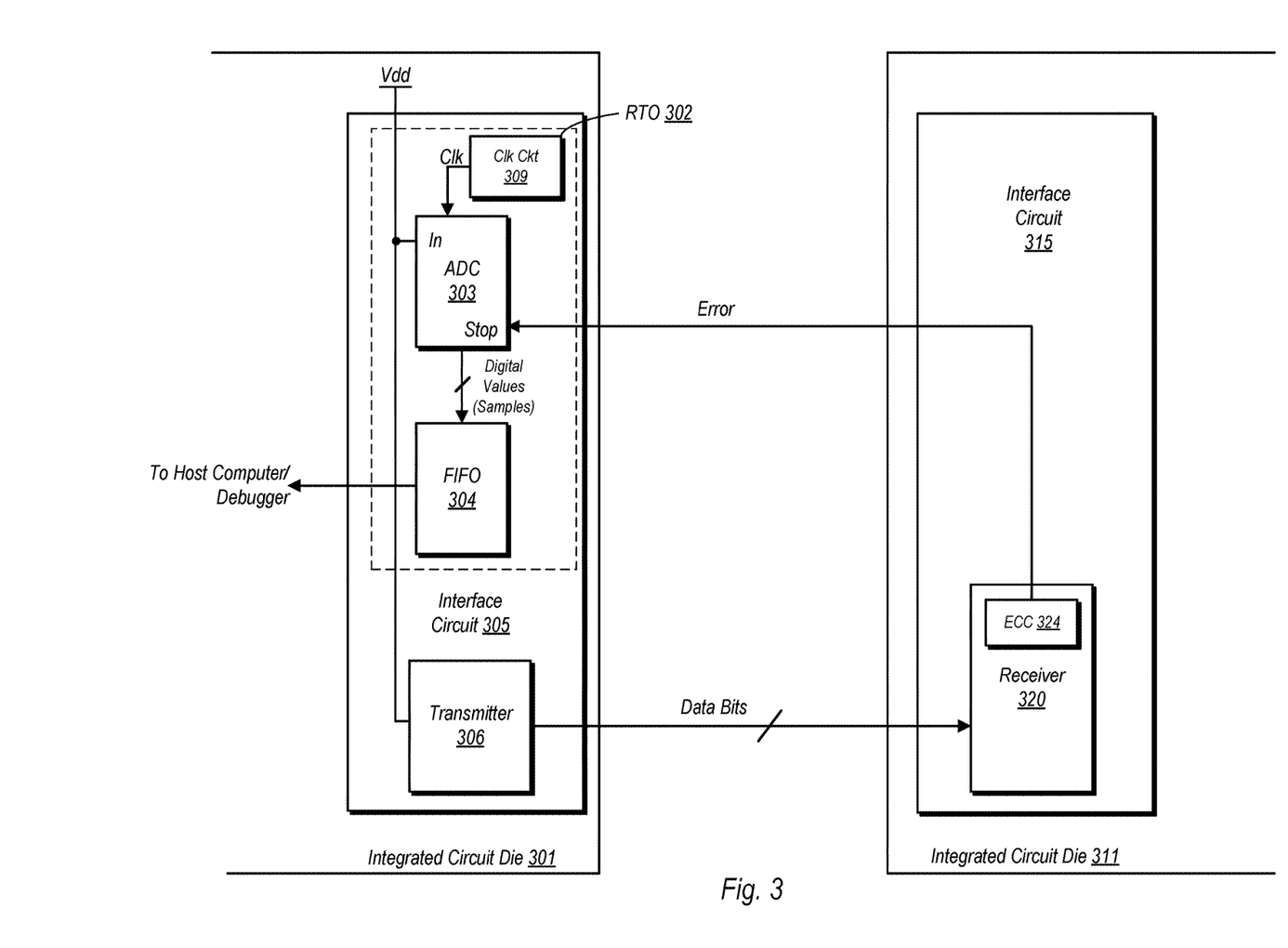
FIG. 3 is a block diagram illustrating one embodiment of first and second interface circuits coupled to one another, with at least one of the interface circuits having a real time oscilloscope/event capture circuit.

FIG. 3 illustrates another embodiment of an interface circuit having an RTO, along with another interface circuit coupled thereto. In the embodiment shown, interface circuit 305 includes RTO 302 and transmitter circuit 306. The transmitter circuitry 306 operates using a supply voltage Vdd, which is also sampled by RTO 302. In one embodiment, transmitter circuitry 306 is capable of transmitting data in parallel, although embodiments in which data is transmitted serially are also possible and contemplated.

Interface circuit 315 in the embodiment shown includes receiver 320, which is coupled to receive data bits transmitted from transmitter circuitry 306. Receiver 320 in the embodiment shown may receive data either in parallel or in series, in accordance with the method in which data is transmitted by transmitter 306.

Receiver 320 in the embodiment shown includes an ECC circuit 324. ECC circuit 324 in the embodiment shown may detect errors in data transmitted from transmitter 306, and in some cases, may correct these errors. In the embodiment shown, ECC circuit 324 may assert an error signal in response to detecting an error in the data transmitted from transmitter 306 to receiver 320. This error signal is transmitted across the interface to RTO 302.

In the embodiment shown RTO 302 includes an ADC 303 that includes an input (In) coupled to receive the supply voltage Vdd for sampling and conversion into digital values. Sampling in the embodiment shown is conducted periodically, in accordance with the clock signal Clk. The clock signal is generated here by a clock circuit 309, which may be implemented using any suitable clock generation circuitry (e.g., a ring oscillator, an analog oscillator having an LC tank circuit, etc.). ADC 303 in the embodiment shown may generate a sample once for each cycle of the clock signal. The frequency of the clock signal may vary from one embodiment to the next. Generally speaking, any suitable frequency for a given application may be selected for the frequency of the clock signal. ADC 303 in the embodiment shown may halt the generation of sampling and generating corresponding digital value is an asserted error condition is received on its Stop input.

Digital samples generated by ADC 303 in the embodiment shown are provided to and stored in a memory circuit, implemented here as first-in, first-out (FIFO) 304. Digital values corresponding to samples of supply voltage Vdd may be stored into and evicted from FIFO 304 in the order in which they were generated by ADC 303. The size of FIFO 304 may vary from one embodiment to the next, and may be chosen based on various factors, including the propagation delay between the time erroneous data was transmitted and the time at which the error indication is received by ADC 303. This may ensure that there are a number of digital values corresponding to samples of the supply voltage both before and after the event which precipitated detection of the error.

Figure 4:
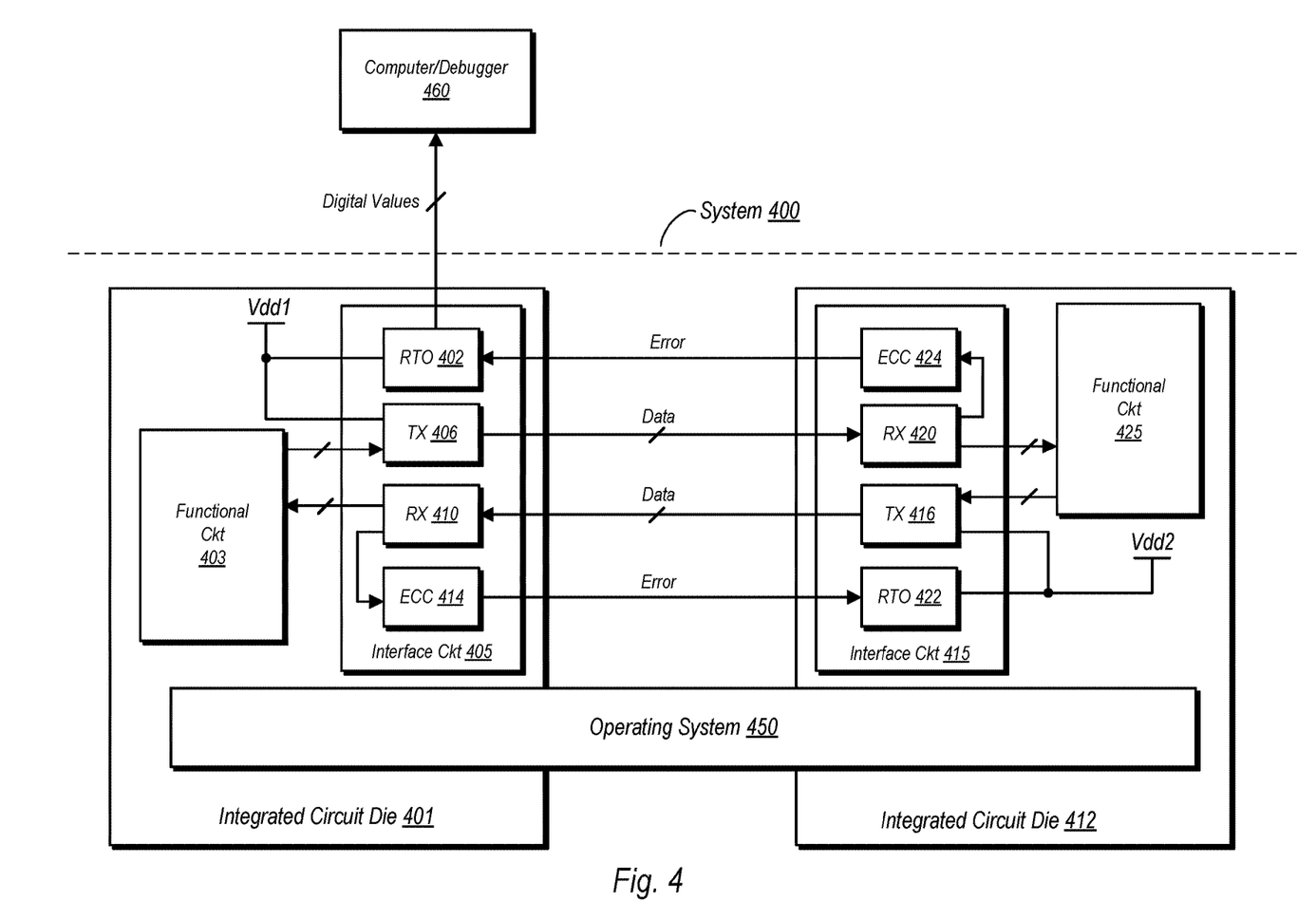
FIG. 4 is a block diagram of one embodiment of a system having a first integrated circuit die and a second integrated circuit die.

FIG. 4 is a block diagram of one embodiment of a system having a first integrated circuit die and a second integrated circuit die. In the embodiment shown, system 400 includes a first integrated circuit die 401 and a second integrated circuit die 412. Integrated circuit die 401 includes functional circuit 403 coupled to an interface circuit 405. Similarly, integrated circuit 412 includes functional circuit 425 and an interface circuit 415. The two integrated circuits shown here are configured to communicate with one another via the interface formed by interface circuits 405 and 415. In one embodiment, integrated circuits 401 and 412 implement a scalable system, as is discussed in further detail below.

The functional circuits 403 and 425 in respective integrated circuit dies 401 and 412 may include a number of different functional circuit units. For example, functional circuits 403 and 425 may include one or more processor cores (which may be heterogenous or homogenous in multi-core embodiments), one or more graphics processing units (GPUs), one or more memory controllers suitable for coupling to a system memory, various types of input/output (I/O) interfaces suitable for coupling to peripheral devices, one or more communications fabrics, and so on.

Interface circuit 405 and interface 415 in the illustrated embodiment form a bi-directional interface, thereby allowing the exchange of data between the two. In some embodiment, the bi-directional interface may share communications lines between integrated circuit dies 401 and 402, while in others these lines may be separated.

Interface circuit 405 includes an RTO 402, a transmitter 406, a receiver 410, and an ECC circuit 414. Similarly, interface circuit 415 includes an RTO 422, a transmitter 416, a receiver 420, and a ECC circuit 424. In the illustrated example, RTO 402 is coupled to a host computer/debugger 460. Although not explicitly shown here, RTO 422 may also be coupled to host computer/debugger 460.

Transmitter 406 in the embodiment shown is configured to transmit data across the interface to receiver 420. RTO 402 may, in one embodiment, monitor a voltage associated with transmitter 406, such as the supply voltage (Vdd1) provided to the latter, in accordance with the discussion above. Transmitter 416 and RTO 422 in integrated circuit 415 may be configured similarly to transmitter 406 and RTO 402. Accordingly, transmitter 416 may receive and operate using supply voltage Vdd2 while this supply voltage may be monitored by RTO 422.

Interface circuit 405 as shown here includes an ECC circuit 414 coupled to receiver 410. ECC circuit 414 is configured to detect errors in data transmitted from transmitter 416 to receiver 410. In response to detecting an error in the received data, ECC circuit 414 may assert an error signal that is transmitted to RTO 422. Similarly, interface circuit 415 includes an ECC circuit 424 configured to detect errors in data transmitted from transmitter 406 to receiver 420. In response to detecting an error in the received data, ECC 424 may assert an error signal that is transmitted to RTO 402. Each of RTOs 402 and 422, in response to receiving a corresponding error signal, may provide, for debug purposes, digital values stored in a corresponding memory circuit (e.g., a FIFO, such as in the embodiment of FIG. 3) to host computer/debugger 460.

As previously noted, integrated circuit dies 401 and 412 may be implemented as a scalable system. In the embodiment shown, integrated circuit dies 401 and 412 may be configured as a single system in which the existences of the multiple dies is transparent to software (e.g., operating system 450) executing on that system. Thus, if both integrated circuit dies 401 and 412 include respective processor cores, software executing on the system may see these two dies as a single entity having multiple processor cores, and thus be effectively unaware that it is being executed across multiple integrated circuit dies.

As a scalable system, system 400 may operate with a single integrated circuit die, but may be scaled up to operate with multiple dies. Furthermore, while the example of FIG. 4 illustrates two integrated circuit dies, embodiments of system 400 that are scalable are not limited to this number, and may thus have a larger number of dies (e.g., 4, 6, 8, etc.) in a given application. However, irrespective of the number of integrated circuit dies used in a scalable system embodiment, software executing thereon may remain transparent with regard to that number.

While specific examples have been given with regard to various embodiments of the RTO/event capture circuit discussed above, it is noted that the disclosure is not intended to be limiting to such embodiments. In contrast, the present disclosure contemplates a wide variety of potential uses of an RTO in which a voltage or signal is monitored by generating digital values through sampling and analog-to-digital conversion, with subsequent storage of the digital values.

Figure 5:
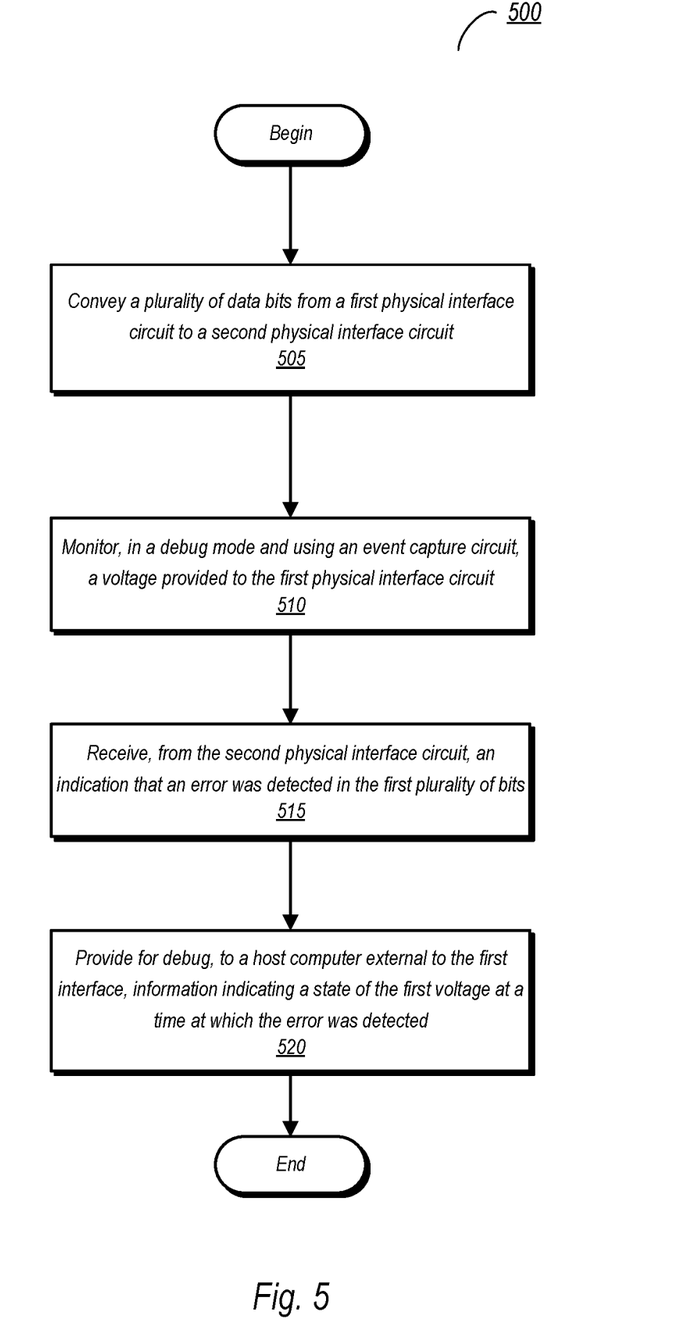
FIG. 5 is a flow diagram of one embodiment of a method for operating a real time oscilloscope/event capture circuit.

Methods of Operating an RTO:

FIG. 5 is a flow diagram of one embodiment of a method for operating an RTO in accordance with this disclosure. Method 500 may be carried out using any of the various hardware embodiments discussed above. Furthermore, embodiments of circuitry capable of carrying out Method 500 but not explicitly discussed herein may nevertheless be considered to fall within the scope of this disclosure.

Method 500 includes conveying a plurality of data bits from a first physical interface circuit to a second physical interface circuit (block 505). The method further includes monitoring, in a debug mode and using an event capture circuit, a voltage provided to the first physical interface circuit (block 510). In various embodiments, the data received by the second physical interface circuit may be checked for errors, with an indication generated in response to detecting an error. Accordingly, Method 500 further includes receiving, from the second physical interface circuit, an indication that an error was detected in the first plurality of bits (block 515). In response to receiving the error, Method 500 further includes providing, for debug and to a host computer external to the first interface, information indicating a state of the first voltage at a time at which the error was detected (block 520).

In various embodiments, the voltage is a supply voltage provided to transmitter circuitry in the first physical interface circuit, wherein conveying the first plurality of bits comprises the transmitter circuitry transmitting the first plurality of bits, in parallel, to the second physical interface circuit.

Irrespective of the type of voltage, monitoring the voltage comprises, in various embodiments, converting samples of the voltage into corresponding digital values using an analog-to-digital converter (ADC) and storing the digital values in a memory. Such method embodiments may further include discontinuing converting samples of the voltage in response to receiving the error indication, and conveying the digital values from the memory to the host computer via a debug interface of an integrated circuit upon which the event capture circuit is implemented.

In some embodiments, the method includes detecting the error in the first plurality of bits using error correction code (ECC) circuitry and asserting the indication using the ECC circuitry.

Various embodiments of the method are implemented in a system having multiple integrated circuit dies. Accordingly, conveying the plurality of data bits from the first physical interface circuit to the second physical interface circuit comprises conveying the plurality of data bits between a first integrated circuit die and a second integrated circuit die, and conveying the indication from the second integrated circuit die to the first integrated circuit die.

Figure 6:
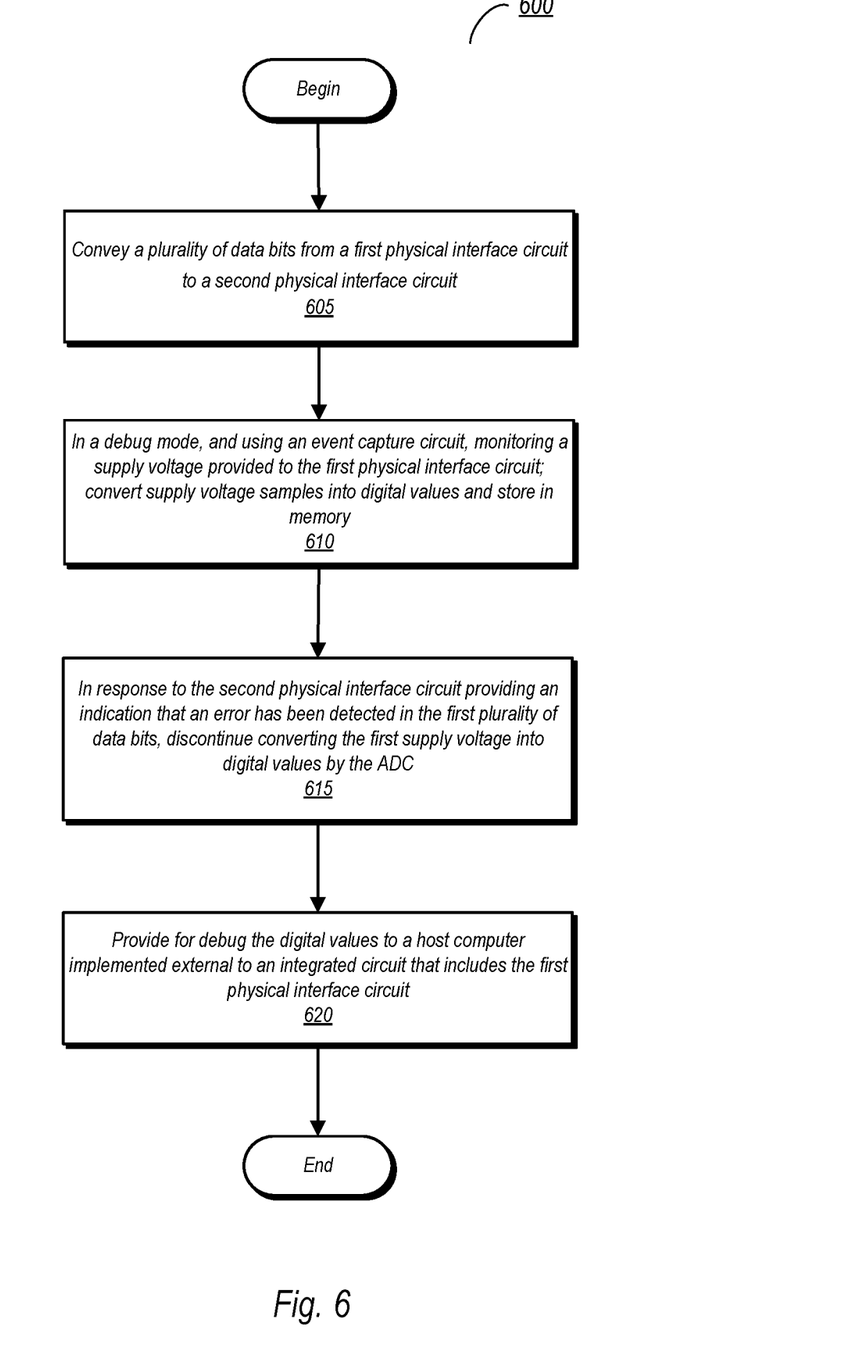
FIG. 6 is a flow diagram of another embodiment of a method for operating a real time oscilloscope/event capture circuit.

FIG. 6 illustrates another embodiment of a method for operating an RTO, and more particularly, one in which a supply voltage is monitored. Method 600 may be carried out by any suitable embodiment of the hardware/circuitry discussed above. Embodiments of hardware/circuitry capable of carrying out Method 600 but not explicitly disclosed herein may be considered to fall within the scope of this disclosure.

Method 600 includes conveying a plurality of data bits from a first physical interface circuit to a second physical interface circuit (block 605). The method further comprises, in a debug mode and using an event capture circuit, monitoring a supply voltage provided to the first physical interface circuit, converting the supply voltage samples into digital values and storing them in memory (block 610). In response to the second physical interface circuit providing an indication that an error has been detected in the first plurality of data bits, Method 600 further includes discontinuing converting the first supply voltage into digital values by the ADC (block 615). Thereafter, Method 600 includes providing for debug the digital values to a host computer implemented external to an integrated circuit that includes the first physical interface circuit (block 620).

Figure 7:
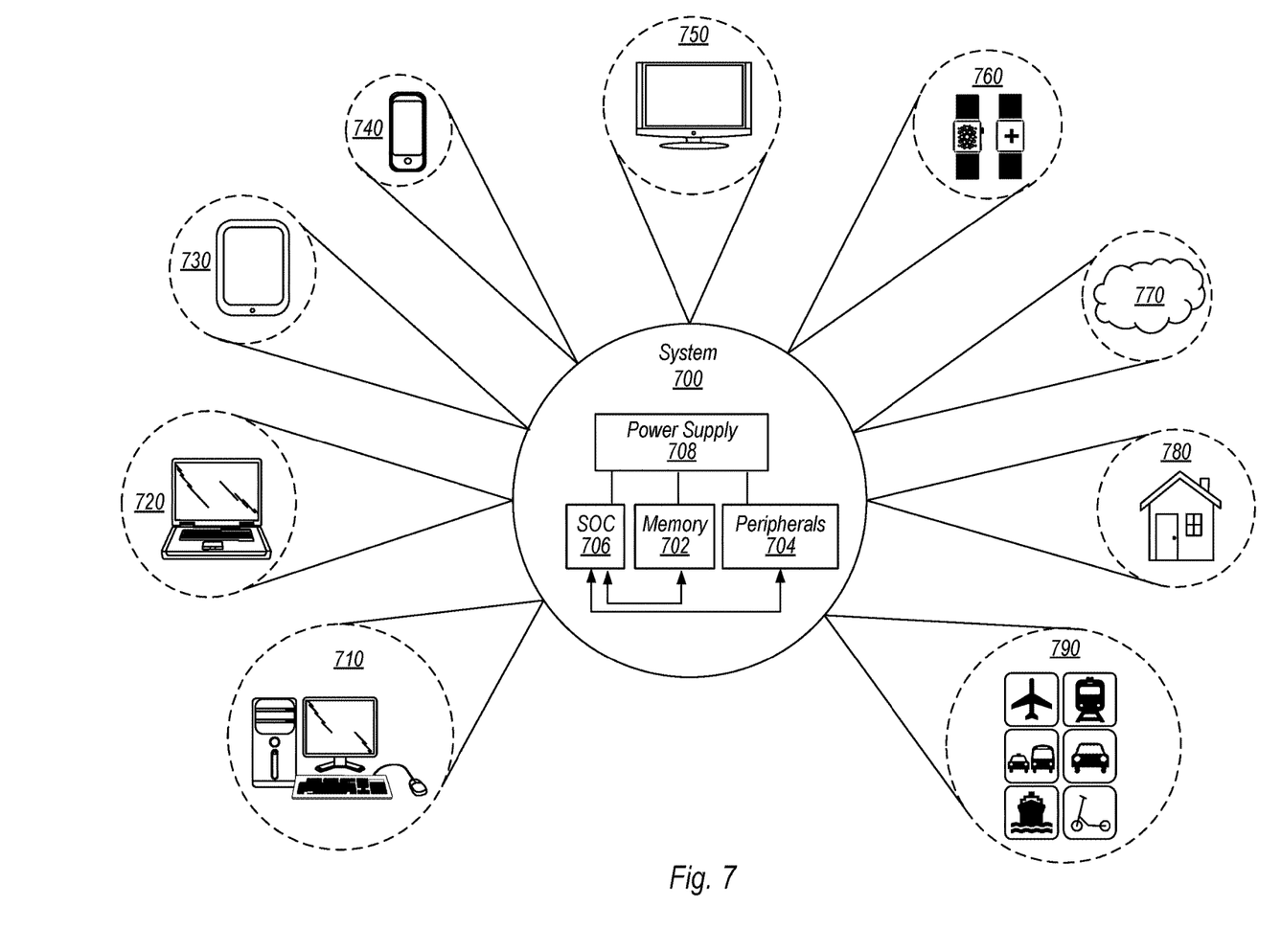
FIG. 7 is a block diagram of one embodiment of an example system.

Example System:

Turning next to FIG. 7, a block diagram of one embodiment of a system 700 is shown that may incorporate and/or otherwise utilize the methods and mechanisms described herein. In the illustrated embodiment, the system 700 includes at least one instance of a system on chip (SoC) 706 which may include multiple types of processing units, such as a central processing unit (CPU), a graphics processing unit (GPU), or otherwise, a communication fabric, and interfaces to memories and input/output devices.

In various embodiments, system 700 may include one or integrated circuits that implement an embodiment of an RTO/event capture circuit as described above. This may include embodiments of an RTO used to monitor voltages associated with an interface between two separate integrated circuit dies.

A power supply 708 is also provided which supplies the supply voltages to SoC 706 as well as one or more supply voltages to the memory 702 and/or the peripherals 704. In various embodiments, power supply 708 represents a battery (e.g., a rechargeable battery in a smart phone, laptop or tablet computer, or other device). In some embodiments, more than one instance of SoC 706 is included (and more than one external memory 702 is included as well).

The memory 702 is any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAMBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 704 include any desired circuitry, depending on the type of system 700. For example, in one embodiment, peripherals 704 includes devices for various types of wireless communication, such as Wi-Fi, Bluetooth, cellular, global positioning system, etc. In some embodiments, the peripherals 704 also include additional storage, including RAM storage, solid state storage, or disk storage. The peripherals 704 include user interface devices such as a display screen, including touch display screens or multi-touch display screens, keyboard or other input devices, microphones, speakers, etc.

As illustrated, system 700 is shown to have application in a wide range of areas. For example, system 700 may be utilized as part of the chips, circuitry, components, etc., of a desktop computer 710, laptop computer 720, tablet computer 730, cellular or mobile phone 740, or television 750 (or set-top box coupled to a television). Also illustrated is a smartwatch and health monitoring device 760. In some embodiments, smartwatch may include a variety of general-purpose computing related functions. For example, smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices are contemplated as well, such as devices worn around the neck, devices that are implantable in the human body, glasses designed to provide an augmented and/or virtual reality experience, and so on.

System 700 may further be used as part of a cloud-based service(s) 770. For example, the previously mentioned devices, and/or other devices, may access computing resources in the cloud (i.e., remotely located hardware and/or software resources). Still further, system 700 may be utilized in one or more devices of a home other than those previously mentioned. For example, appliances within the home may monitor and detect conditions that warrant attention. For example, various devices within the home (e.g., a refrigerator, a cooling system, etc.) may monitor the status of the device and provide an alert to the homeowner (or, for example, a repair facility) should a particular event be detected. Alternatively, a thermostat may monitor the temperature in the home and may automate adjustments to a heating/cooling system based on a history of responses to various conditions by the homeowner. Also illustrated in FIG. 7 is the application of system 700 to various modes of transportation. For example, system 700 may be used in the control and/or entertainment systems of aircraft, trains, buses, cars for hire, private automobiles, waterborne vessels from private boats to cruise liners, scooters (for rent or owned), and so on. In various cases, system 700 may be used to provide automated guidance (e.g., self-driving vehicles), general systems control, and otherwise. These any many other embodiments are possible and are contemplated. It is noted that the devices and applications illustrated in FIG. 7 are illustrative only and are not intended to be limiting. Other devices are possible and are contemplated.

The present disclosure includes references to "an "embodiment" or groups of "embodiments" (e.g., "some embodiments" or "various embodiments"). Embodiments are different implementations or instances of the disclosed concepts. References to "an embodiment," "one embodiment," "a particular embodiment," and the like do not necessarily refer to the same embodiment. A large number of possible embodiments are contemplated, including those specifically disclosed, as well as modifications or alternatives that fall within the spirit or scope of the disclosure.

This disclosure may discuss potential advantages that may arise from the disclosed embodiments. Not all implementations of these embodiments will necessarily manifest any or all of the potential advantages. Whether an advantage is realized for a particular implementation depends on many factors, some of which are outside the scope of this disclosure. In fact, there are a number of reasons why an implementation that falls within the scope of the claims might not exhibit some or all of any disclosed advantages. For example, a particular implementation might include other circuitry outside the scope of the disclosure that, in conjunction with one of the disclosed embodiments, negates or diminishes one or more the disclosed advantages. Furthermore, suboptimal design execution of a particular implementation (e.g., implementation techniques or tools) could also negate or diminish disclosed advantages. Even assuming a skilled implementation, realization of advantages may still depend upon other factors such as the environmental circumstances in which the implementation is deployed. For example, inputs supplied to a particular implementation may prevent one or more problems addressed in this disclosure from arising on a particular occasion, with the result that the benefit of its solution may not be realized. Given the existence of possible factors external to this disclosure, it is expressly intended that any potential advantages described herein are not to be construed as claim limitations that must be met to demonstrate infringement. Rather, identification of such potential advantages is intended to illustrate the type(s) of improvement available to designers having the benefit of this disclosure. That such advantages are described permissively (e.g., stating that a particular advantage "may arise") is not intended to convey doubt about whether such advantages can in fact be realized, but rather to recognize the technical reality that realization of such advantages often depends on additional factors.

Unless stated otherwise, embodiments are non-limiting. That is, the disclosed embodiments are not intended to limit the scope of claims that are drafted based on this disclosure, even where only a single example is described with respect to a particular feature. The disclosed embodiments are intended to be illustrative rather than restrictive, absent any statements in the disclosure to the contrary. The application is thus intended to permit claims covering disclosed embodiments, as well as such alternatives, modifications, and equivalents that would be apparent to a person skilled in the art having the benefit of this disclosure.

For example, features in this application may be combined in any suitable manner. Accordingly, new claims may be formulated during prosecution of this application (or an application claiming priority thereto) to any such combination of features. In particular, with reference to the appended claims, features from dependent claims may be combined with those of other dependent claims where appropriate, including claims that depend from other independent claims. Similarly, features from respective independent claims may be combined where appropriate.

Accordingly, while the appended dependent claims may be drafted such that each depends on a single other claim, additional dependencies are also contemplated. Any combinations of features in the dependent that are consistent with this disclosure are contemplated and may be claimed in this or another application. In short, combinations are not limited to those specifically enumerated in the appended claims.

Where appropriate, it is also contemplated that claims drafted in one format or statutory type (e.g., apparatus) are intended to support corresponding claims of another format or statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to a singular form of an item (i.e., a noun or noun phrase preceded by "a," "an," or "the") are, unless context clearly dictates otherwise, intended to mean "one or more." Reference to "an item" in a claim thus does not, without accompanying context, preclude additional instances of the item. A "plurality" of items refers to a set of two or more of the items.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," and thus covers 1) x but not y, 2) y but not x, and 3) both x and y. On the other hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one element of the set [w, x, y, z], thereby covering all possible combinations in this list of elements. This phrase is not to be interpreted to require that there is at least one instance of w, at least one instance of x, at least one instance of y, and at least one instance of z.

Various "labels" may precede nouns or noun phrases in this disclosure. Unless context provides otherwise, different labels used for a feature (e.g., "first circuit," "second circuit," "particular circuit," "given circuit," etc.) refer to different instances of the feature. Additionally, the labels "first," "second," and "third" when applied to a feature do not imply any type of ordering (e.g., spatial, temporal, logical, etc.), unless stated otherwise.

The phrase "based on" or is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrases "in response to" and "responsive to" describe one or more factors that trigger an effect. This phrase does not foreclose the possibility that additional factors may affect or otherwise trigger the effect, either jointly with the specified factors or independent from the specified factors. That is, an effect may be solely in response to those factors, or may be in response to the specified factors as well as other, unspecified factors. Consider the phrase "perform A in response to B." This phrase specifies that B is a factor that triggers the performance of A, or that triggers a particular result for A. This phrase does not foreclose that performing A may also be in response to some other factor, such as C. This phrase also does not foreclose that performing A may be jointly in response to B and C. This phrase is also intended to cover an embodiment in which A is performed solely in response to B. As used herein, the phrase "responsive to" is synonymous with the phrase "responsive at least in part to." Similarly, the phrase "in response to" is synonymous with the phrase "at least in part in response to."

Within this disclosure, different entities (which may variously be referred to as "units," "circuits," other components, etc.) may be described or claimed as "configured" to perform one or more tasks or operations. This formulation [entity]—configured to [perform one or more tasks]—is used herein to refer to structure Le something physical). More specifically, this formulation is used to indicate that this structure is arranged to perform the one or more tasks during operation. A structure can be said to be "configured to" perform some task even if the structure is not currently being operated. Thus, an entity, described or recited as being "configured to" perform some task refers to something physical, such as a device, circuit, a system having a processor unit and a memory storing program instructions executable to implement the task, etc. This phrase is not used herein to refer to something intangible.

In some cases, various units/circuits/components may be described herein as performing a set of task or operations. It is understood that those entities are "configured to" perform those tasks/operations, even if not specifically noted.

The term "configured to" is not intended to mean "configurable to." An unprogrammed FPGA, for example, would not be considered to be "configured to" perform a particular function. This unprogrammed FPGA may be "configurable to" perform that function, however. After appropriate programming, the FPGA may then be said to be "configured to" perform the particular function.

For purposes of United States patent applications based on this disclosure, reciting in a claim that a structure is "configured to" perform one or more tasks is expressly intended not to invoke 35 U.S.C. § 112(f) for that claim element. Should Applicant wish to invoke Section 112(*f*) during prosecution of a United States patent application based on this disclosure, it will recite claim elements using the "means for" [performing a function] construct.

Different "circuits" may be described in this disclosure. These circuits or "circuitry" constitute hardware that includes various types of circuit elements, such as combinatorial logic, clocked storage devices (e.g., flip-flops, registers, latches, etc.), finite state machines, memory (e.g., random-access memory, embedded dynamic random-access memory), programmable logic arrays, and so on. Circuitry may be custom designed, or taken from standard libraries. In various implementations, circuitry can, as appropriate, include digital components, analog components, or a combination of both. Certain types of circuits may be commonly referred to as "units" (e.g., a decode unit, an arithmetic logic unit (ALU), functional unit, memory management unit (MMU), etc.). Such units also refer to circuits or circuitry.

The disclosed circuits/units/components and other elements illustrated in the drawings and described herein thus include hardware elements such as those described in the preceding paragraph. In many instances, the internal arrangement of hardware elements within a particular circuit may be specified by describing the function of that circuit. For example, a particular "decode unit" may be described as performing the function of "processing an opcode of an instruction and routing that instruction to one or more of a plurality of functional units," which means that the decode unit is "configured to" perform this function. This specification of function is sufficient, to those skilled in the computer arts, to connote a set of possible structures for the circuit.

In various embodiments, as discussed in the preceding paragraph, circuits, units, and other elements defined by the functions or operations that they are configured to implement, The arrangement and such circuits/units/components with respect to each other and the manner in which they interact form a microarchitectural definition of the hardware that is ultimately manufactured in an integrated circuit or programmed into an FPGA to form a physical implementation of the microarchitectural definition. Thus, the microarchitectural definition is recognized by those of skill in the art as structure from which many physical implementations may be derived, all of which fall into the broader structure described by the microarchitectural definition. That is, a skilled artisan presented with the microarchitectural definition supplied in accordance with this disclosure may, without undue experimentation and with the application of ordinary skill, implement the structure by coding the description of the circuits/units/components in a hardware description language (HDL) such as Verilog or VHDL. The HDL description is often expressed in a fashion that may appear to be functional. But to those of skill in the art in this field, this HDL description is the manner that is used transform the structure of a circuit, unit, or component to the next level of implementational detail. Such an HDL description may take the form of behavioral code (which is typically not synthesizable), register transfer language (RTL) code (which, in contrast to behavioral code, is typically synthesizable), or structural code (e.g., a netlist specifying logic gates and their connectivity). The HDL description may subsequently be synthesized against a library of cells designed for a given integrated circuit fabrication technology, and may be modified for timing, power, and other reasons to result in a final design database that is transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA. This decoupling between the design of a group of circuits and the subsequent low-level implementation of these circuits commonly results in the scenario in which the circuit or logic designer never specifies a particular set of structures for the low-level implementation beyond a description of what the circuit is configured to do, as this process is performed at a different stage of the circuit implementation process.

The fact that many different low-level combinations of circuit elements may be used to implement the same specification of a circuit results in a large number of equivalent structures for that circuit. As noted, these low-level circuit implementations may vary according to changes in the fabrication technology, the foundry selected to manufacture the integrated circuit, the library of cells provided for a particular project, etc. In many cases, the choices made by different design tools or methodologies to produce these different implementations may be arbitrary.

Moreover, it is common for a single implementation of a particular functional specification of a circuit to include, for a given embodiment, a large number of devices (e.g., millions of transistors). Accordingly, the sheer volume of this information makes it impractical to provide a full recitation of the low-level structure used to implement a single embodiment, let alone the vast array of equivalent possible implementations. For this reason, the present disclosure describes structure of circuits using the functional shorthand commonly employed in the industry.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a first physical interface circuit; and
   a real-time oscilloscope circuit configured to monitor a first voltage provided to the first physical interface circuit, wherein the real-time oscilloscope circuit is configured to:
   receive an indication that an error was detected in data transmitted from the first physical interface circuit to a second physical interface circuit; and
   provide for debug, to a host computer external to the first physical interface circuit, information indicating a state of the first voltage at a time at which the error was detected.

2. The apparatus of claim 1, wherein the first voltage is a supply voltage provided to transmitter circuitry configured to transmit data from the first physical interface circuit.

3. The apparatus of claim 1, wherein the real-time oscilloscope circuit includes:
   an analog-to-digital converter (ADC) configured to convert the first voltage into one or more digital values indicative of a level of the first voltage; and
   a memory configured to store the one or more digital values.

4. The apparatus of claim 3, wherein the memory is a first-in, first-out (FIFO) memory.

5. The apparatus of claim 3, wherein the ADC is configured to discontinue converting the first voltage into digital values in response to receiving the indication of the error.

6. The apparatus of claim 1, wherein the first interface circuit is implemented on a first integrated circuit die separate from a second integrated circuit die implementing the second physical interface circuit.

7. A method comprising:
   conveying a plurality of data bits from a first physical interface circuit to a second physical interface circuit;
   monitoring, in a debug mode and using an event capture circuit, a first voltage provided to the first physical interface circuit;
   receiving, from the second physical interface circuit, an indication that an error was detected in the plurality of data bits; and
   providing for debug, to a host computer external to the first interface, information indicating a state of the first voltage at a time at which the error was detected.

8. The method of claim 7, wherein the voltage is a supply voltage provided to transmitter circuitry in the first physical interface circuit, wherein conveying the plurality of data bits comprises the transmitter circuitry transmitting the plurality of data bits, in parallel, to the second physical interface circuit.

9. The method of claim 7, wherein monitoring the voltage comprises:
   converting samples of the voltage into corresponding digital values using an analog-to-digital converter (ADC); and
   storing the digital values in a memory.

10. The method of claim 9, further comprising discontinuing converting samples of the voltage in response to receiving the error indication.

11. The method of claim 9, further comprising conveying the digital values from the memory to the host computer via a debug interface of an integrated circuit upon which the event capture circuit is implemented.

12. The method of claim 7, further comprising:
 detecting the error in the plurality of data bits using error correction code (ECC) circuitry; and
 asserting the indication using the ECC circuitry.

13. The method of claim 7, wherein conveying the plurality of data bits from the first physical interface circuit to the second physical interface circuit comprises conveying the plurality of data bits between a first integrated circuit die and a second integrated circuit die, and conveying the indication from the second integrated circuit die to the first integrated circuit die.

14. A system comprising:
 a first physical interface circuit coupled to receive a supply voltage, wherein the first physical interface circuit includes transmitter circuitry configured to transmit a plurality of data bits;
 a second physical interface circuit configured to receive the plurality of data bits transmitted by the transmitter circuitry, wherein the second physical interface circuit includes error detection circuitry configured to assert an indication in response to detecting an error in the plurality of data bits; and
 an event capture circuit configured to, in a debug mode, monitor the supply voltage provided to the transmitter circuitry, and further configured to provide for debug, in response to the error detection circuit generating the indication, information indicative of a state of the supply voltage at a time the error was detected to a host computer system external to the first interface circuit.

15. The system of claim 14, wherein the event capture circuit includes:
 an analog-to-digital converter (ADC) configured to convert samples of the supply voltage into digital values; and
 a memory configured to store the digital values.

16. The system of claim 15, wherein the ADC is configured to discontinue converting samples of the supply voltage in response to receiving the indication.

17. The system of claim 15, wherein the memory is a first-in, first-out memory.

18. The system of claim 14, wherein the error detection circuitry comprises error correction code (ECC) circuitry.

19. The system of claim 14, wherein the first interface circuit is implemented on a first integrated circuit die, and wherein the second interface circuit is implemented on a second integrated circuit die.

20. The system of claim 19, wherein the first and second integrated circuit dies are configured as a single system in which existence of multiple integrated circuit dies is transparent to software executing on the single system.

* * * * *